(12) United States Patent
Motoyama et al.

(10) Patent No.: US 12,191,140 B2
(45) Date of Patent: Jan. 7, 2025

(54) METHOD FOR MANUFACTURING SEMICONDUCTOR DEVICE AND SUBSTRATE PROCESSING APPARATUS

(71) Applicant: Tokyo Electron Limited, Tokyo (JP)

(72) Inventors: Yutaka Motoyama, Yamanashi (JP); Atsushi Endo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 245 days.

(21) Appl. No.: 17/804,170

(22) Filed: May 26, 2022

(65) Prior Publication Data

US 2022/0384184 A1    Dec. 1, 2022

(30) Foreign Application Priority Data

Jun. 1, 2021 (JP) ................................ 2021-092474

(51) Int. Cl.
*H01L 21/02* (2006.01)
*C23C 16/458* (2006.01)

(52) U.S. Cl.
CPC .... *H01L 21/02123* (2013.01); *C23C 16/4584* (2013.01); *H01L 21/02252* (2013.01)

(58) Field of Classification Search
CPC ......... H01L 21/02123; H01L 21/02252; H01L 21/02381; H01L 21/0243; H01L 21/0245; H01L 21/02532; H01L 21/0262; H01L 21/02639; C23C 16/4584; C23C 16/24; C23C 16/455; C23C 16/045
See application file for complete search history.

(56) References Cited

U.S. PATENT DOCUMENTS

2017/0365465 A1\* 12/2017 Okada ............... H01L 21/02488
2018/0040475 A1\*  2/2018 Miyakura ......... C23C 16/45523

FOREIGN PATENT DOCUMENTS

JP      2017-228580        12/2017

\* cited by examiner

*Primary Examiner* — Julia Slutsker
(74) *Attorney, Agent, or Firm* — IPUSA, PLLC

(57) ABSTRACT

A method for manufacturing a semiconductor device includes supplying a silicon-containing gas to a substrate having a recess formed in a surface of the substrate to deposit a silicon film in the recess, supplying, to the substrate, a first etching gas having a first etching profile in which an amount of etching for an upper portion of the recess in a depth direction and an amount of etching for a lower portion of the recess in the depth direction are different from each other, to etch the silicon film in the recess, supplying, to the substrate, a second etching gas having a second etching profile that is different from the first etching profile of the first etching gas to etch the silicon film in the recess, and additionally depositing the silicon film on the already deposited silicon film etched by the second etching gas.

15 Claims, 10 Drawing Sheets

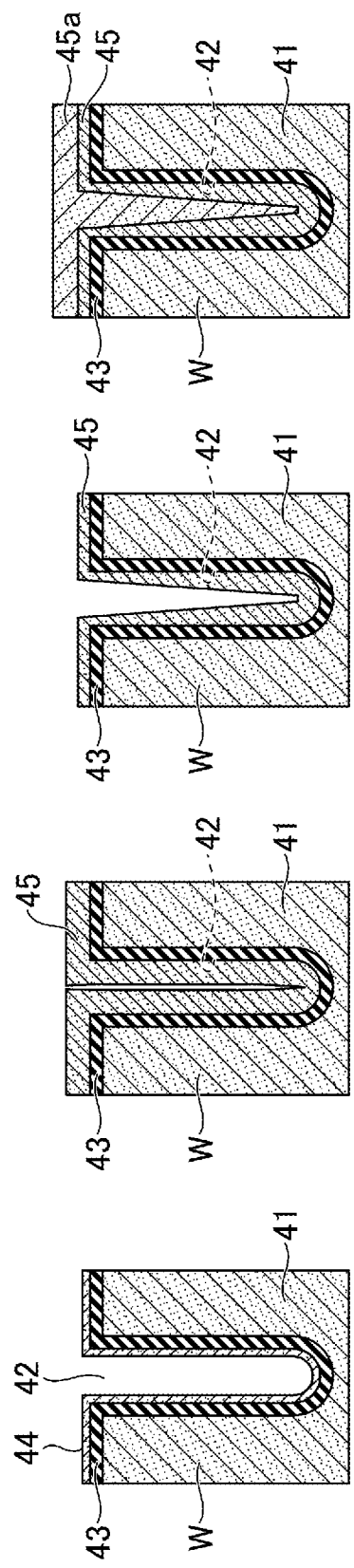

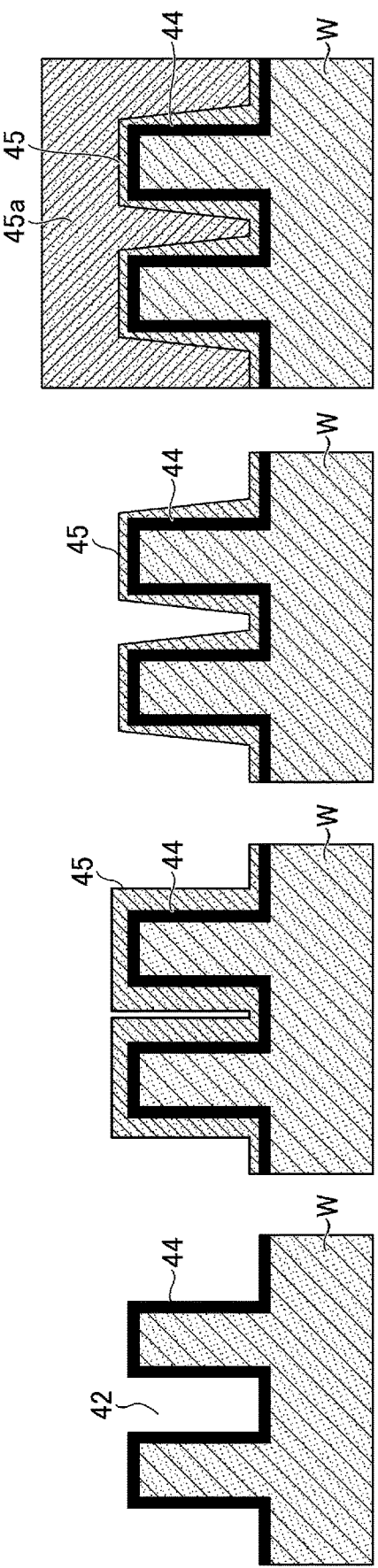

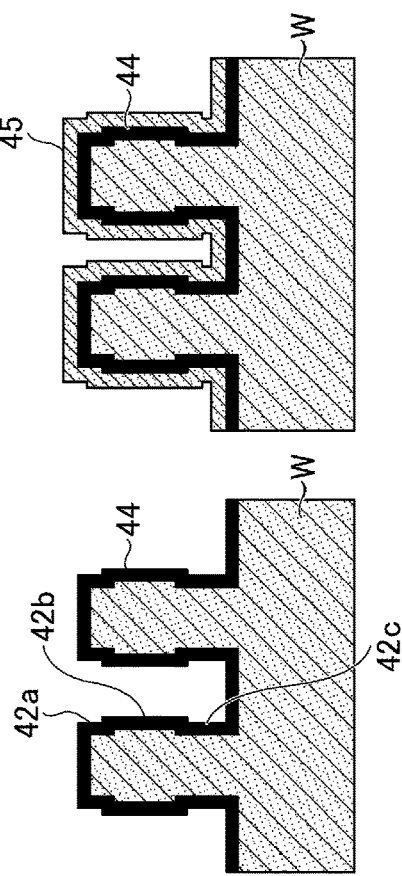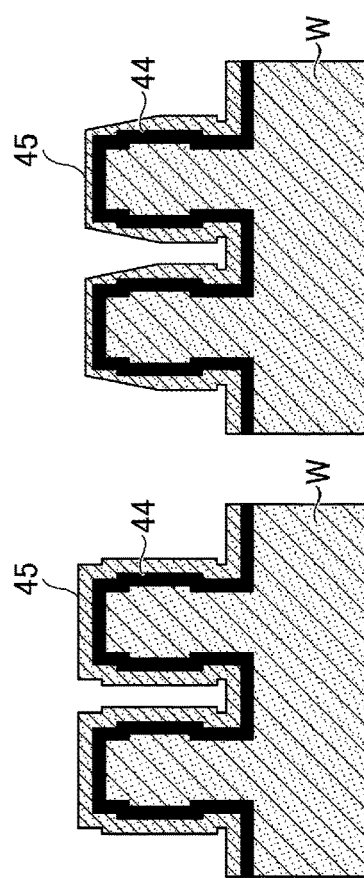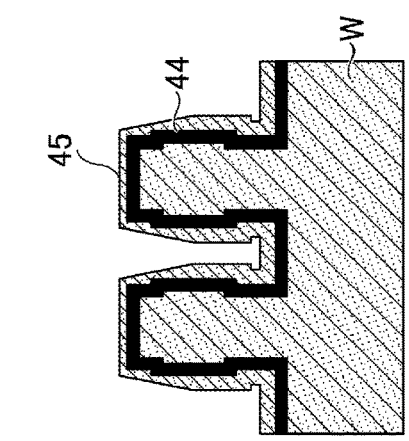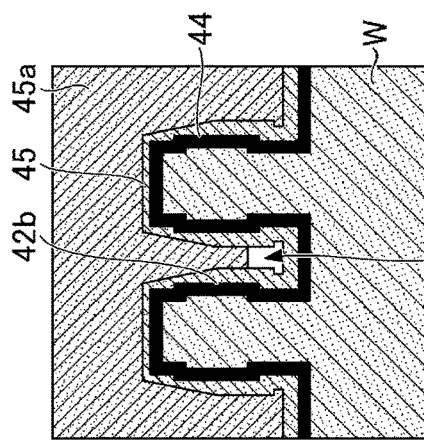

METHOD FOR MANUFACTURING SEMICONDUCTOR DEVICE AND SUBSTRATE PROCESSING APPARATUS

CROSS-REFERENCE TO RELATED APPLICATION

The present application is based on and claims priority to Japanese Priority Application No. 2021-092474 filed on Jun. 1, 2021, the entire contents of which are hereby incorporated herein by reference.

BACKGROUND OF THE INVENTION

1. Field of the Invention

The present disclosure relates to a method for manufacturing a semiconductor device and a substrate processing device.

2. Description of the Related Art

DED (Deposition Etch Deposition) process that repeats deposition and etching is known.

SUMMARY OF THE INVENTION

An embodiment of the present disclosure provides a method for manufacturing a semiconductor device, the method including:
- supplying a silicon-containing gas to a substrate having a recess formed in a surface of the substrate to deposit a silicon film in the recess;
- supplying, to the substrate, a first etching gas having a first etching profile in which an amount of etching for an upper portion of the recess in a depth direction and an amount of etching for a lower portion of the recess in the depth direction are different from each other, to etch the silicon film in the recess;
- supplying, to the substrate, a second etching gas having a second etching profile that is different from the first etching profile of the first etching gas to etch the silicon film in the recess; and
- additionally depositing the silicon film on the already deposited silicon film etched by the second etching gas.

BRIEF DESCRIPTION OF THE DRAWINGS

FIGS. 3A to 3D are drawings illustrating an example of a typical conventional DED process;

FIGS. 4A to 4D are drawings illustrating a DED process in a case where a lateral surface of a recess is flat;

FIGS. 5A to 5D are drawings illustrating a DED process in a case where a lateral surface of a recess is not flat;

DETAILED DESCRIPTION OF THE PREFERRED EMBODIMENTS

Japanese Laid-Open Patent Application Publication No. 2017-228580 discloses a method for manufacturing a semiconductor device for filling a recess with a silicon film by repeating a cycle of supplying a film deposition gas containing silicon to a workpiece including the recess formed in a surface to form a silicon film in the recess, supplying a process gas including a halogen gas for etching a silicon film and a roughness inhibiting gas for inhibiting the roughness of the surface of the silicon film after etching by the halogen gas, supplying thermal energy to the process gas to activate the process gas, and expanding the opening width of the recess. Such a filling method is referred to as a DED (Deposition Etch Deposition) process because the method repeats deposition and etching.

Provided is a method for manufacturing a semiconductor device and a substrate processing device capable of filling a recess with a film without generating a void, even in a case where there is unevenness on a lateral surface in the recess that is in such a shape that a void is likely to be generated.

Hereinafter, embodiments for carrying out the present invention will be described with reference to the drawings.

Figure 1:
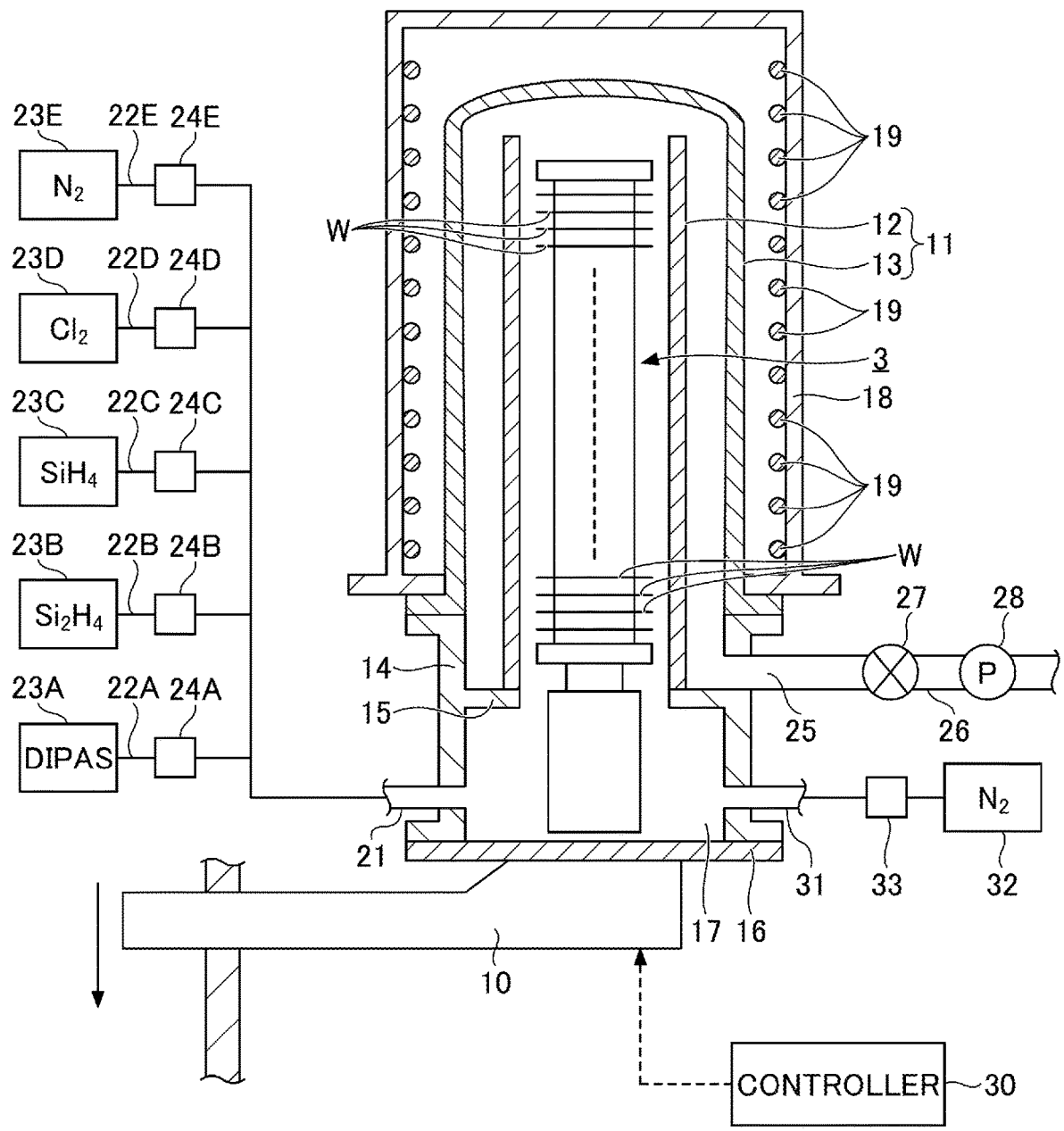
FIG. 1 is a substrate processing apparatus according to an embodiment of the present disclosure.

FIG. 1 is a diagram illustrating a substrate processing apparatus according to an embodiment of the present disclosure. In the present embodiment, an example in which the substrate processing apparatus is formed as a vertical heat processing apparatus will be described. Incidentally, the substrate processing apparatus according to the present disclosure is not limited to the vertical heat processing apparatus, but may be applied to a variety of substrate processing apparatuses that can alternately perform film deposition and etching. Applicable substrate processing apparatuses also include a single-wafer substrate processing apparatus and a semi-batch substrate processing apparatus. In the present embodiment, an example in which the substrate processing apparatus is formed as a vertical heat treatment apparatus will be described.

The vertical heat processing apparatus performs a DED process to form a logic device of a semiconductor device in a substrate that is a wafer W. That is, the film deposition process and the etching process are performed on a wafer W. The film deposition process is performed by a thermal CVD (Chemical Vapor Deposition), and the etching process is performed by a reactive gas etching in which thermal energy is supplied to the etching gas.

The logical device to be manufactured includes a logical device using, for example, a FinFET that is the next generation transistor of a MOSFET (Metal Oxide Semiconductor Field Effect Transistor), in addition to the logical device manufactured by conventional art.

The vertical heat processing apparatus includes a reactor tube 11 that is an approximately cylindrical vacuum chamber and the longitudinal direction thereof is oriented to the vertical direction. The reactor tube 11 has a dual tube structure including an inner tube 12, and an outer tube 13 with a ceiling formed so as to cover the inner tube 12 and to have a constant distance from the inner tube 12. The inner tube 12 and the outer tube 13 are formed of a heat resistant material such as quartz. The reactor tube 11 forms a closed space for processing the substrate and may therefore be referred to as a processing chamber.

A manifold 14 made of stainless steel (SUS) formed into a cylindrical shape is disposed below the outer tube 13. The manifold 14 is hermetically connected to the lower end of the outer tube 13. The inner tube 12 protrudes from the inner wall of the manifold 14 and is supported by a support ring 15 integrally formed with the manifold 14.

A lid 16 is disposed below the manifold 14, and a boat elevator 10 allows the lid 16 to be moved up and down between an elevated position and a lowered position. FIG. 1 illustrates the lid 16 located in the elevated position, where the lid 16 closes an opening 17 of the reactor tube 11 below the manifold 14 to seal the inside of the reactor tube 11. The lid 16 includes a wafer boat 3 made of, for example, quartz. The wafer boat 3 is configured to horizontally hold a number of wafers W to be processed as substrates in a stacked manner at a predetermined vertical distance. Around the reactor tube 11, an insulator 18 is disposed to surround the reactor tube 11, and an inner wall thereof has a heater 19 made of a resistance heating element, which is, for example, a heating part, so that the inside of the reactor tube 11 can be heated.

At the manifold 14, below the support ring 15 described above, a process gas inlet tube 21 and a purge gas inlet tube 31 are inserted, and the downstream end of each gas inlet tube 21, 31 is arranged so as to supply a gas to a wafer W within the inner tube 12. For example, the upstream side of the process gas inlet tube 21 branches to form branches 22A to 22E, and each upstream end of the branches 22A to 22E is connected to a gas supply source 23A of diisopropylaminosilane (DIPAS) gas, a gas supply source 23B of disilane ($Si_2H_6$) gas, a gas supply source 23C of monoaminosilane ($SiH_4$) gas, a gas supply source 23D of chlorine ($Cl_2$) gas, and a gas supply source 23E of nitrogen ($N_2$) gas. The branches 22A to 22E include gas supply mechanisms 24A to 24E, respectively. The gas supply mechanisms 24A to 24E each include valves and mass flow controllers configured to control the flow rate of the process gas supplied from the gas supply sources 23A to 23E to the process gas inlet tube 21, respectively.

DIPAS gas is a gas for forming a seed layer to form a first seed layer on a surface of a silicon oxide film formed on a surface of a wafer W, and the gas supply source 23A and the gas supply mechanism 24A constitute a DIPAS gas supply part.

$Si_2H_6$ gas is a gas for forming a second seed layer on the surface of the first seed layer, and the gas supply source 23B and the gas supply mechanism 24B constitute a $Si_2H_6$ (disilane) gas supply part.

DIPAS gas supply part and the disilane gas supply part are gas supply parts for forming the seed layer, and thus may be referred to as a seed layer forming gas supply part.

In the present embodiment, two types of gases for forming the seed layer are described, but any one type of gas for forming the seed layer may be used. In addition, when the film is formed on the wafer W on which the seed layer is already formed, the seed layer forming gas supply part may not be disposed. In addition, gases other than DIPAS gas and $Si_2H_6$ gas may be used, even if a seed layer forming gas supply part is used. Thus, the DIPAS gas supply part, the disilane gas supply part, and the seed layer forming gas supply part may be provided as necessary.

$SiH_4$ gas is a deposition gas for depositing a silicon (Si) film on the wafer W, and the gas supply source 23C and the gas supply mechanism 24C constitute a silicon-containing gas supply part. Because the silicon-containing gas is a gas used for depositing the film, the silicon-containing gas supply part may be referred to as a film deposition gas supply part.

$Cl_2$ gas is an etching gas for etching the Si film, and the gas supply source 23D and the gas supply mechanism 24D constitute a chlorine gas supply part. $N_2$ gas is diluent gas for changing an etching profile in a depth direction of a recess 42 of etching gas, and the gas supply source 23E and the gas supply mechanism 24E constitute a nitrogen gas supply part. Note that the chlorine gas and the nitrogen gas are supplied simultaneously as etching gas, and therefore, the chlorine gas supply part and the nitrogen gas supply part may be collectively referred to as an etching gas supply part.

The upstream side of the purge gas inlet tube 31 is connected to a supply source 32 of nitrogen ($N_2$) gas, which is a purge gas. A gas supply mechanism 33 is disposed in the purge gas inlet tube 31. The gas supply mechanism 33 is configured similar to the gas supply mechanisms 24A to 24E to control a flow rate of the purge gas downstream of the gas inlet tube 31.

In the manifold 14, an exhaust port 25 opens in a lateral surface of an upper portion of the support ring 15, and an exhaust gas generated in the inner tube 12 passes through a space formed between the inner tube 12 and the outer tube 13 and is exhausted to the exhaust port 25. An exhaust pipe 26 is hermetically connected to the exhaust port 25. A valve 27 and a vacuum pump 28 are disposed in this order from an upstream side of the exhaust pipe 26. By adjusting the opening of the valve 27, the pressure in the reactor tube 11 is controlled to the desired pressure.

The vertical heat processing apparatus includes a controller 30 that is constituted of a computer, and the controller 30 includes a program. In this program, a group of steps is configured so that a control signal can be output to each part of the vertical heat processing apparatus 1 to control the operation of each part so that a series of processing operations described below can be performed on a wafer W. Specifically, a control signal is output to control the elevation of the lid 16 by the boat elevator 10, the output of the heater 19 (that is, the temperature of the wafer W), the opening of the valve 27, and the flow rate of each gas into the reactor tube 11 by the gas supply mechanisms 24A to 24C, and 33. The program is stored in a storage medium such as a hard disk, a flexible disk, a compact disk, a magneto optical disk (MO), a memory card, or the like in the controller 30.

Figure 2:
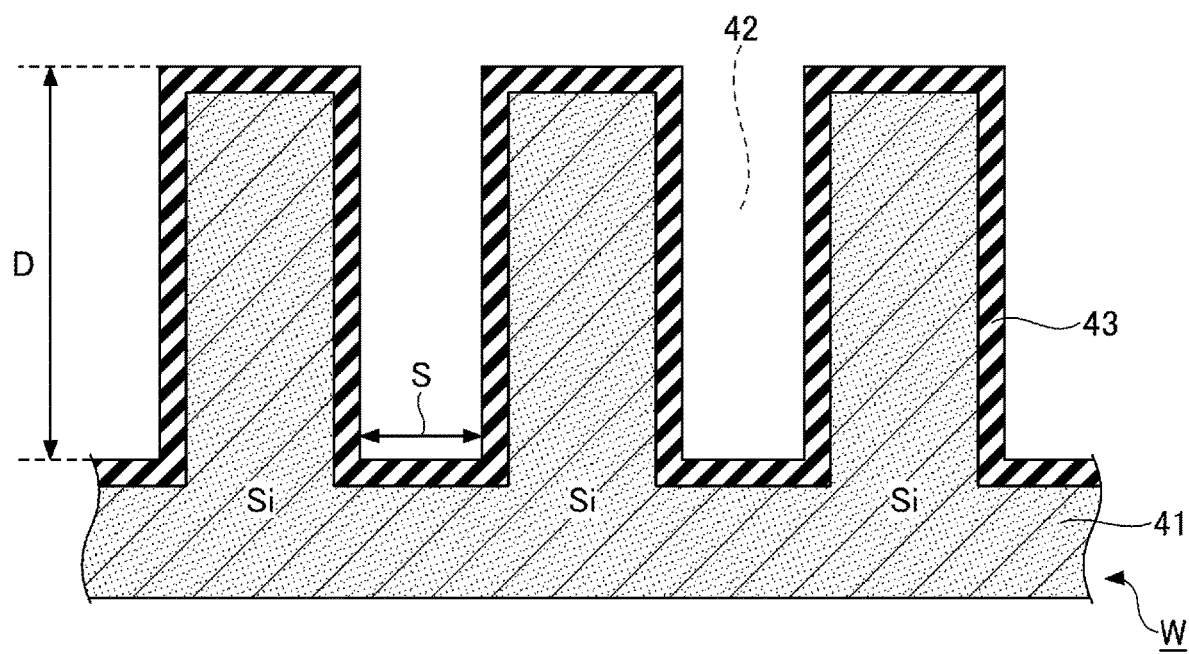
FIG. 2 is a drawing illustrating an example of a shape of a recess formed in a surface of a wafer.

FIG. 2 is a diagram illustrating an example of a shape of a recess formed in a surface of a wafer W. As illustrated in FIG. 2, a silicon (Si) layer 41 is provided on the surface of the wafer W. The surface layer of the Si layer 41 is oxidized and a silicon oxide film 43 is formed. Recesses 42 having a depth D and an opening width S are formed. The recesses 42 are formed, for example, as trenches or through holes, but may have any particular shapes as long as the recesses 42 have depressed shapes.

In FIG. 2, each of the aspect ratios of the recesses 42 is D/S. Each of the aspect ratios of the recesses is, for example, two or more.

First, a general method for filling the recesses 42 with a silicon film by applying a DED process to the recess 42 as illustrated in FIG. 2 will be described.

FIGS. 3A to 3D are diagrams illustrating an example of a general and conventional DED process.

FIG. 3A illustrates a seed layer forming step for forming a seed layer 44 on a surface of a wafer W having a recess 42 in a surface. In the seed layer forming step, a thin silicon film is formed as the seed layer 44 on the surface of a silicon oxide film 43 formed on the surface of the wafer W. For the formation of the seed layer 44, for example, $Si_2H_6$ is used as a film deposition gas.

FIG. 3B illustrates a first film deposition process. In the first film deposition step, for example, $SiH_4$ gas is used as a film deposition gas, and formed as a layer on the surface of the wafer W, and a silicon film 45 is deposited in the recess 42.

FIG. 3C illustrates an example of an etching process. In the etching process, the deposited silicon film 45 is etched to widen the opening so that the top end is not blocked. Then, a cross-section of the V-shape is formed in the silicon film 45.

FIG. 3D illustrates a second deposition process. In the second film deposition process, a new silicon film 45a is deposited on the V-shaped silicon film 45, and the entire recess 42 is filled with the silicon films 45 and 45a.

While such a filling method is the DED process, recesses 42 of a high aspect ratio can be filled with the silicon films 45 and 45a without void.

FIGS. 4A to 4D are drawings illustrating a DED process in a case where the lateral surface of the recess 42 is flat.

FIG. 4A is a drawing illustrating an example of a shape of the recess 42. As illustrated in FIG. 4A, the recess 42 has a flat lateral surface, and has the seed layer 44 formed on the surface of the recess 42.

FIG. 4B is a drawing illustrating an example of a first deposition step. Silicon-containing gas is supplied to deposit the silicon film 45 in the recess 42. This narrows the opening of the recess 42.

FIG. 4C is a drawing illustrating an example of an etching step. In the etching step, the cross section of the silicon film 45 deposited in the recess 42 is made into a V shape. This widens the opening.

FIG. 4D is a drawing illustrating an example of a second deposition step. This widens the opening, the opening portion of the silicon film 45 is filled with the silicon film 45a without forming a void, and the entirety of the recess 42 can be filled with the silicon films 45 and 45a without a void.

FIG. 5 is a drawing illustrating an example of a DED process in a case where the lateral surface of the recess 42a has a protrusion 42b that is not a flat surface.

FIG. 5A is a drawing illustrating an example of a shape of the recess 42a. As illustrated in FIG. 5A, the protrusion 42b is formed on the lateral surface of the recess 42a, and the lateral surface is an unevenness surface.

FIG. 5B is a drawing illustrating an example of a deposition step. In the deposition step, the silicon film 45 is basically formed in a conformal manner, and accordingly, the silicon film 45 is formed along the shape of the recess 42a such that the protrusion 42b protrudes toward the inside.

FIG. 5C is a drawing illustrating an example of an etching step. In the etching step, etching is performed to form a V shape, and accordingly, the upper portion widely opens, but the other portion is not etched appreciably.

FIG. 5D is a drawing illustrating an example of a second deposition step. In the second deposition step, the opening at the protrusion 42b is narrow, and this prevents silicon-containing gas from reaching a depressed portion 42c at the lower portion of the recess 42a. Due to the presence of the protrusion 42b, the depressed portion 42c in the depressed shape is not filled, and a void remains.

Specifically, in the case of the recess 42a having unevenness, the recess 42a cannot be filled with the silicon films 45 and 45a even if the DED process as illustrated in FIGS. 3A to 3D and FIGS. 4A to 4D is executed.

The protrusion 42b may be formed due to a problem in processing accuracy, or may be intentionally formed into such a shape. In any case, in the actual process, some of the recesses 42a may have unevenness, which are difficult to be filled.

Therefore, in the present disclosure, a method for filling even the recess 42a having unevenness with a silicon film without generating a void is suggested.

FIGS. 6A to 6E are drawings illustrating an example of a method for manufacturing a semiconductor device according to an embodiment of the present disclosure. A method for manufacturing a semiconductor device according to the present embodiment are explained with reference to FIG. 1 and FIGS. 6A to 6E.

First, the wafer W described in FIG. 2 is transferred and held in the wafer boat 3 by a transfer mechanism (not illustrated). Thereafter, the wafer boat 3 is placed on the lid 16 that is located at the lowered position. The lid 16 is then raised to the elevated position; the wafer boat 3 is introduced into the reactor tube 11; the lid 16 closes the opening 17 of the reactor tube 11, and the inside of the reactor tube 11 is made airtight. Subsequently, a purge gas is supplied into the reactor tube 11; the inside of the reactor tube 11 is evacuated to a vacuum atmosphere of a predetermined pressure; and the wafer W is heated by the heater 19 to a predetermined temperature. The temperature is set to a predetermined deposition temperature suitable for depositing a silicon film on the wafer W. The controller 30 may control the temperature of the heater 19.

For example, in a case where $SiH_4$ gas is used as the deposition gas, $SiH_4$ gas may be in the range of 440 to 530° C. to be set at a predetermined temperature that can be controlled with chlorine etching gas.

Figure 6A:
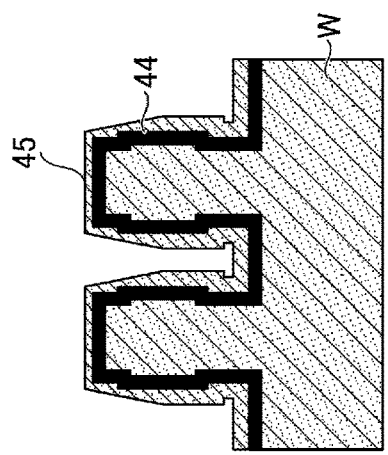
FIGS. 6A to 6E are drawings illustrating an example of a method for manufacturing a semiconductor device according to an embodiment of the present disclosure.

FIG. 6A is a drawing illustrating an example of a seed layer forming step.

After the wafer W is heated, the purge gas supply is stopped and DIPAS gas is supplied into the reactor tube 11. DIPAS gas is deposited on the surface of the silicon oxide film 43 of the wafer W, and the seed layer 44 is formed so as to coat the silicon oxide film 43 (see FIG. 6A).

Thereafter, the DIPAS gas supply is stopped; the purge gas is supplied to the reactor tube 11; DIPAS gas is purged from the reactor tube 11; and $Si_2H_6$ gas is supplied to the reactor tube 11. $Si_2H_6$ gas is deposited on the first seed layer, and a second seed layer is formed to coat the first seed layer. Thereafter, the $Si_2H_6$ gas supply is stopped and the purge gas is supplied to the reactor tube 11 to purge $Si_2H_6$ gas from the reactor tube 11.

Figure 6B:
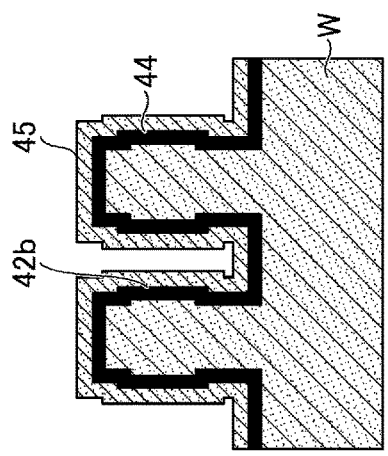

FIG. 6B illustrates an example of a first film deposition step.

After the seed layer forming step, the purge gas supply is stopped and $SiH_4$ gas is supplied into the reactor tube 11. As illustrated in FIG. 6B, $SiH_4$ gas is deposited on the second seed layer and formed over the whole surface of the wafer W so that the silicon film 45 covers the second seed layer. Then, $SiH_4$ gas continues to be deposited and the silicon film 45 grows. That is, the thickness of the silicon film 45 increases. Then, for example, as illustrated in FIG. 6B, the $SiH_4$ gas supply stops before the upper side of the recess 42a is blocked by the silicon film 45. At this stage, the protrusion 42b has a very narrow gap from opposing sides of the silicon film 45.

After the $SiH_4$ gas supply is stopped, a purge gas is supplied into the reactor tube 11, and $SiH_4$ gas is purged from the reactor tube 11.

Figure 6C:
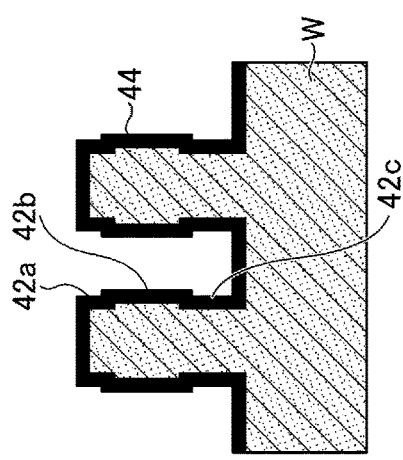

FIG. 6C illustrates an example of a first etching step. In the first etching step, $Cl_2$ gas from the gas supply source 23D and $N_2$ gas from the gas supply source 23E are mixed in the process gas inlet tube 21 and supplied through the process gas inlet tube 21 to a wafer W in the reactor tube 11 (see FIG. 1).

$Cl_2$ gas is an etching gas for the silicon film 45, and produces active species such as Cl radicals by being heated and receiving thermal energy in the reactor tube 11. Because the active species are relatively reactive to Si, the active species react with Si outside the recess 42 and on the upper side of the recess 42, and produce $SiCl_4$ (silicon tetrachloride) and etch the silicon film 45 until the active species reach the lower part in the recess 42 of the wafer W. Accordingly, etching is performed so that the decrease in thickness of the upper-side silicon film 45 within the recess 42 is greater than the decrease in thickness of the lower-side silicon film 45 within the recess 42, thereby increasing the opening width on the upper side within the recess 42. One mole of $Cl_2$ produces two moles of Cl radicals. In other words, because relatively many active species are generated, expanding the opening width of the recess can proceed at a relatively high rate.

In this case, the amount of nitrogen gas to be supplied is reduced, and etching is performed so as to widen the opening in the V shape. Specifically, etching is performed in a state similar to a conventional V shape formation.

The flow ratios of chlorine gas and nitrogen gas may be configured such that, for example, the flow rate of chlorine gas is higher than the flow rate of nitrogen gas. For example, the flow ratio of chlorine gas to nitrogen gas may be 10:1 to 9, may be 10:4 to 8, or may be 10:6 to 7.

For example, in a case where the flow rate of chlorine gas is 1 slm, the flow rate of nitrogen gas may be set to 0.65 slm. Etching can be performed without greatly changing the etching profile of chlorine gas in the depth direction in which the amount of etching for the upper portion in the depth direction of the recess 42a is large and the amount of etching for the lower portion in the depth direction of the recess 42a is low, and the opening of the silicon film 45 in the recess 42a can be widened greatly.

Figure 6E:
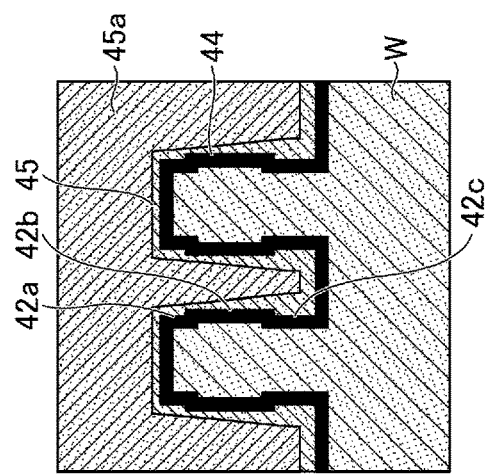
Figure 6D:
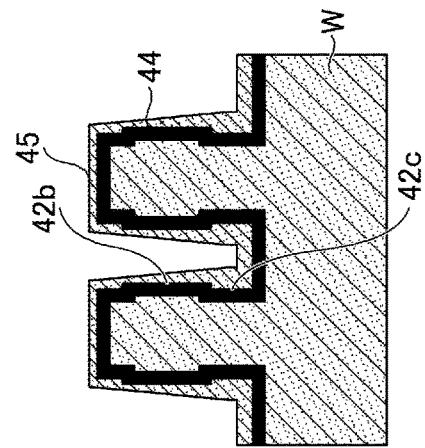

FIG. 6D is a drawing illustrating an example of a second etching step. In the second etching step, almost conformal etching is performed to form a narrow V shape. Accordingly, in the recess 42a, an opening around the protrusion 45b and an opening around the depressed portion 42c below the protrusion 45b can be widened. When the opening at the protrusion 42b and the opening at the depressed portion 42c below the protrusion 42b are widened, the silicon film 45 is caused to reach the depressed portion 42c, and filling can be attained without generating a void in a subsequent deposition.

In the second etching step, $Cl_2$ gas from the gas supply source 23D and $N_2$ gas from the gas supply source 23E are mixed in the process gas inlet tube 21 and supplied through the process gas inlet tube 21 to a wafer W in the reactor tube 11 (see FIG. 1).

However, mixing ratios of chlorine gas and nitrogen gas are set differently from the first etching gas. The second etching gas is set so as to reduce chlorine's effect of increasing the opening width on the upper portion side and cause the etching to be in a state close to conformal. Specifically, the second etching gas is adjusted to have such an etching profile as to form a V shape of which the opening width is small and which extends deeply. Specifically, the flow ratio of nitrogen gas is increased. For example, the flow ratio of chlorine gas to nitrogen gas may be 1:2 to 10, may be 1:3 to 8, or may be 1:4 to 7. For example, when the flow rate of chlorine gas is 1 slm, the flow rate of nitrogen gas may be set to 5.75 slm.

When etching is performed with the second etching gas having an etching profile close to conformal as described above, the opening width below the protrusion 42b can be widened to allow silicon-containing gas to enter the recess deeply.

Thereafter, supply of $Cl_2$ gas and $N_2$ gas to the reactor tube 11 is stopped to end the etching processing.

Next, a purge gas is supplied to remove the mixed gas from the reactor tube 11. Then, after a predetermined period of time elapses, supply of the purge gas is stopped.

FIG. 6E is a drawing illustrating an example of the second deposition step. In the second deposition step, silicon-containing gas, for example, $SiH_4$ gas, is supplied to deposit a new silicon film 45a on the etched silicon film 45. At this occasion, the opening in the recess 42a is formed such that a sufficient opening width is attained up to the lower portion, and therefore, the recess 42a can be filled with the silicon film 45a without generating a void.

Once all recesses 42a have been filled with a silicon film, the temperature in the reactor tube 11 is lowered. During the process, the temperature is maintained at a constant deposition temperature, but when the process is completed, the temperature in the reactor tube 11 is decreased to take out the wafer W. This causes the wafer W to cool down.

Subsequently, after the lid 16 is lowered and the wafer boat 3 is unloaded from the reactor tube 11, the wafer W is removed from the wafer boat 3 by a transport mechanism (not illustrated) and one batch of a wafer W process is completed. Because the processing temperature can be kept constant during the process, the filling process can be performed in a short time.

As described above, in the method for manufacturing the semiconductor device according to the present embodiment, two types of etching gases having different etching profiles in the depth direction are used to perform etching in two steps, so that even with the recess 42a having unevenness, the opening width can be widened by etching, and the recess 42a can be filled without generating a void.

In the case of FIG. 6, for example, first, the opening width of the upper portion is widened with the first etching gas having a clearly V-shaped etching profile, and subsequently, the opening width of the deep portion is widened with the second etching gas having a less-clearly V-shaped etching profile that is almost close to conformal, but depending on the shape of the recess 42a, it may be preferable to reverse the order of the two types of etching explained above.

Therefore, in such a case, it is possible to perform a two-step etching such that a deep and narrow opening is formed with the first etching, and in the second step, the opening on the upper portion is widened. Furthermore, a two-step etching process may be performed by introducing etching gas having a still different etching profile and diluent gas having a different profile.

In this manner, with the method for manufacturing the semiconductor device according to the present embodiment, first, what kind of procedure is appropriate for forming the opening of the recess 42a is considered according to an uneven shape of the recess 42a, and accordingly, two-step etching is performed or three-step etching may be performed as necessary, so that an opening is formed without generating a void.

Next, etching characteristics of the first etching gas and the second etching gas are explained.

Figure 7:
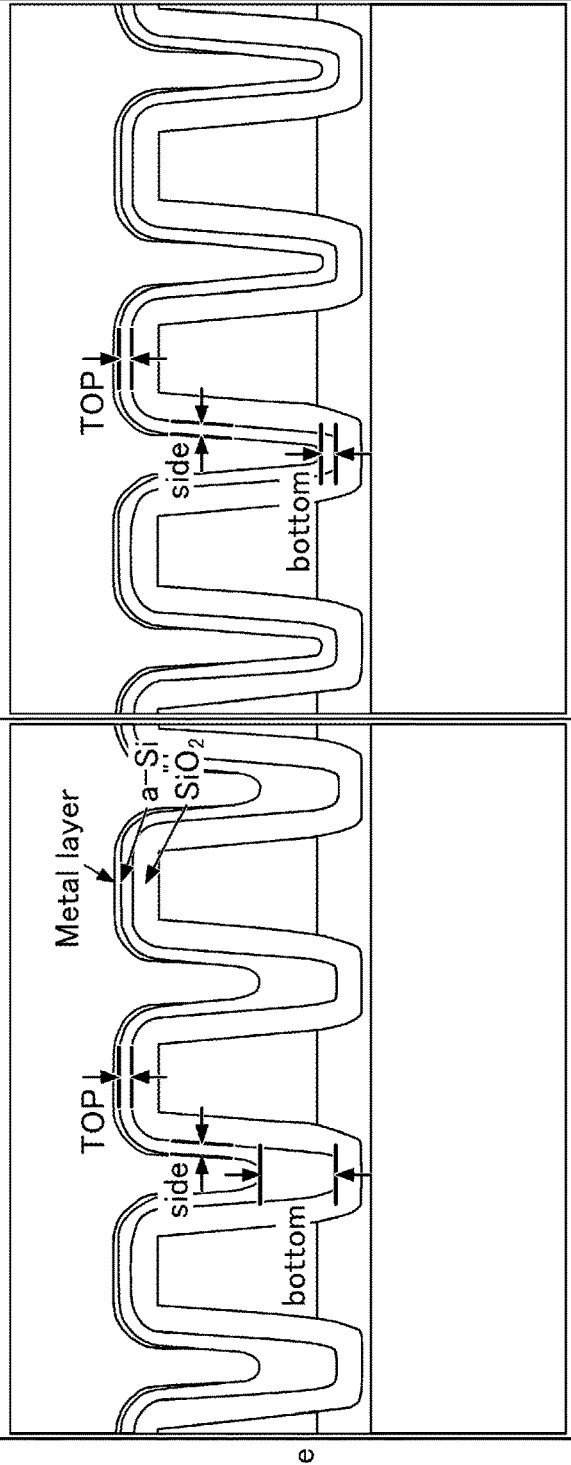
FIG. 7 is a diagram for explaining an etching profile in a depth direction of a first etching gas and a second etching gas.

FIG. 7 is a diagram for explaining etching profiles in the depth direction of the first etching gas and the second etching gas.

The column (a) of FIG. 7 illustrates an example of the first etching gas of FIGS. 6A to 6E. The first etching gas is gas with a low dilution of nitrogen gas. In the column (a) of FIG. 7, for example, a ratio of chlorine to nitrogen is 1 slm to 0.65 slm. In this manner, the first etching gas may be configured to have chlorine and nitrogen mixed such that the flow rate of chlorine is higher than the flow rate of nitrogen. Therefore, the opening in the clear V shape can be formed by making use of the etching profile of chlorine gas and chlorine radicals that widens the opening width on the upper portion.

The column (a) of FIG. 7 shows data in a case where the first etching is performed under a condition of 375° C. and 3 Torr. Specifically, where the film thickness of the silicon film on the surface of the wafer between the recesses is referred to as a "top", the film thickness on the lateral surface of the recess is referred to as a "side", and the film thickness on the bottom surface of the recess is referred to as a "bottom", a ratio of side/top is 106.4%, whereas a ratio of bottom/top is 146.0%, which has an etching profile with a clear V shape such that the opening on the upper portion is large and the lower portion is not appreciably etched. Such an etching portion is effective to greatly enlarge the opening of the upper portion of the recess.

The column (b) of FIG. 7 illustrates an example of the second etching gas of FIGS. 6A to 6E. The second etching gas is gas with a high dilution of nitrogen gas. In the column (b) of FIG. 7, for example, a ratio of chlorine to nitrogen is 1 slm to 5.75 slm. In this manner, the second etching gas may be configured to have chlorine and nitrogen mixed such that the flow rate of chlorine is lower than the flow rate of nitrogen. Accordingly, the amount of etching for the upper portion by chlorine gas and chlorine radicals is less than the amount of etching for the lower portion by chlorine gas and chlorine radicals, and the opening in the less clear V shape can be formed to etch the recess deeply without greatly enlarging the opening width.

Similar to the column (a) of FIG. 7, the column (b) of FIG. 7 shows data in a case where the second etching is performed under a condition of 375° C. and 3 Torr. Specifically, where the film thickness of the silicon film on the surface of the wafer between the recesses is referred to as a "top", the film thickness on the lateral surface of the recess is referred to as a "side", and the film thickness on the bottom surface of the recess is referred to as a "bottom", a ratio of side/top is 104.1%, whereas a ratio of bottom/top is 125.1%, which has an etching profile similar to conformal, with a less clear V shape such that there is not an appreciable difference between the amount of etching for the upper portion and the amount of etching for the lower portion. This etching profile is effective for enlarging the openings on the upper portion and the lower portion of the recess with the same amount of etching.

As can be understood from the ratio of bottom/top of 146.0% obtained as a result of the first etching with the first etching gas and the ratio of bottom/top of 125.1% obtained as a result of the second etching with the second etching gas, a ratio of the amount of etching for the lower portion to the amount of etching for the upper portion in the second etching profile of the second etching gas is more than a ratio of the amount of etching for the lower portion to the amount of etching for the upper portion in the first etching profile of the first etching gas, or in the second etching profile of the second etching gas, the amount of etching for the upper portion is the same as the amount of etching for the lower portion.

As described above, two types of etching gases having different etching profiles in the depth direction of the recess are used to perform two-step etching, so that even when there is unevenness in the recess, an opening with an appropriate opening width can be formed.

Next, various embodiments of DED processes using the first etching and second etching are explained.

Figure 8:
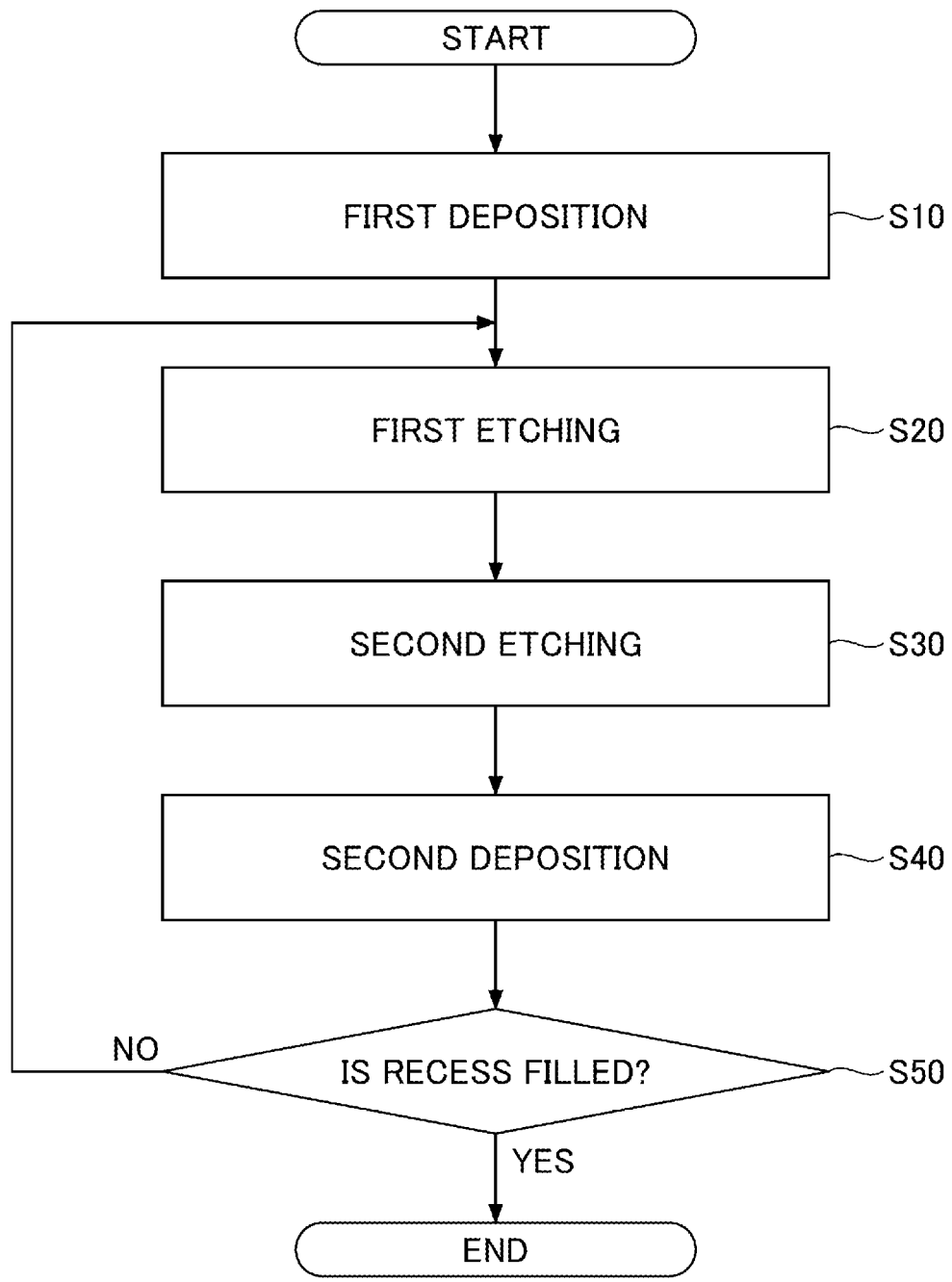
FIG. 8 is a processing flow diagram illustrating an example of a method for manufacturing a semiconductor device according to a first embodiment.

FIG. 8 is a processing flow diagram illustrating an example of a method for manufacturing a semiconductor device according to a first embodiment. This is the most simple process similar to what has been explained with reference to FIGS. 6A to 6E.

In step S10, the first deposition step is performed. This corresponds to the step explained with reference to FIG. 6B. Specifically, the silicon film 45 is deposited in the recess 42a having the seed layer 44 formed on the surface thereof. The silicon film 45 is formed along the shape of the recess 42a in a conformal manner.

In step S20, the first etching step is formed. This is a step corresponding to FIG. 6C. In the first etching step, the first etching gas having such characteristics that the amount of etching is higher on the upper portion than on the lower portion is used to widen the opening on the upper portion of the silicon film 45.

In step S30, the second etching step is performed. This is a step corresponding to FIG. 6D. In the second etching step, the second etching gas having such a conformal etching profile that there is not an appreciable difference between the amount of etching for the upper portion and the amount of etching for the lower portion is used to perform etching to enlarge the opening at the protrusion 42b and the opening at the depressed portion 42c below the protrusion 42b.

In step S40, the second deposition step is performed. This is a step corresponding to FIG. 6E. In the second deposition step, deposition is performed to fill the opening enlarged by the second etching and the opening enlarged by the first etching.

In step S50, a determination is made as to whether the recess 42a has been filled. In FIG. 6, for example, the entirety of the recess 42a is filled with depositions performed twice. However, in a case where the aspect ratio is high or in a case where the shape of the recess 42a is complicated, it may be impossible to fill the entirety of the recess 42a with depositions performed twice.

Therefore, in step S50, a determination is made as to whether the recess 42a has been completely filled with the silicon film 45a. In a case where it is determined that the recess 42a has been completely filled, the processing flow is ended. In a case where it is determined that the recess 42a has not been completely filled, the processing flow returns back to step S20 to repeat the first etching step to the second deposition step. In a case where it is determined that the recess 42a has been completely filled with the silicon films 45 and 45a in step S50, the processing flow is ended.

Where the first etching step is denoted as E1, the second etching step is denoted as E2, and all of the deposition steps are denoted as D, the processing flow of FIG. 8 is a series of steps that repeat a cycle of "DE1E2D".

For example, with such a processing flow, the recess 42a can be filled without generating a void in the recess 42a.

Supply of the purge gas may be switched as appropriate when the deposition step and the etching step are switched.

Figure 9:
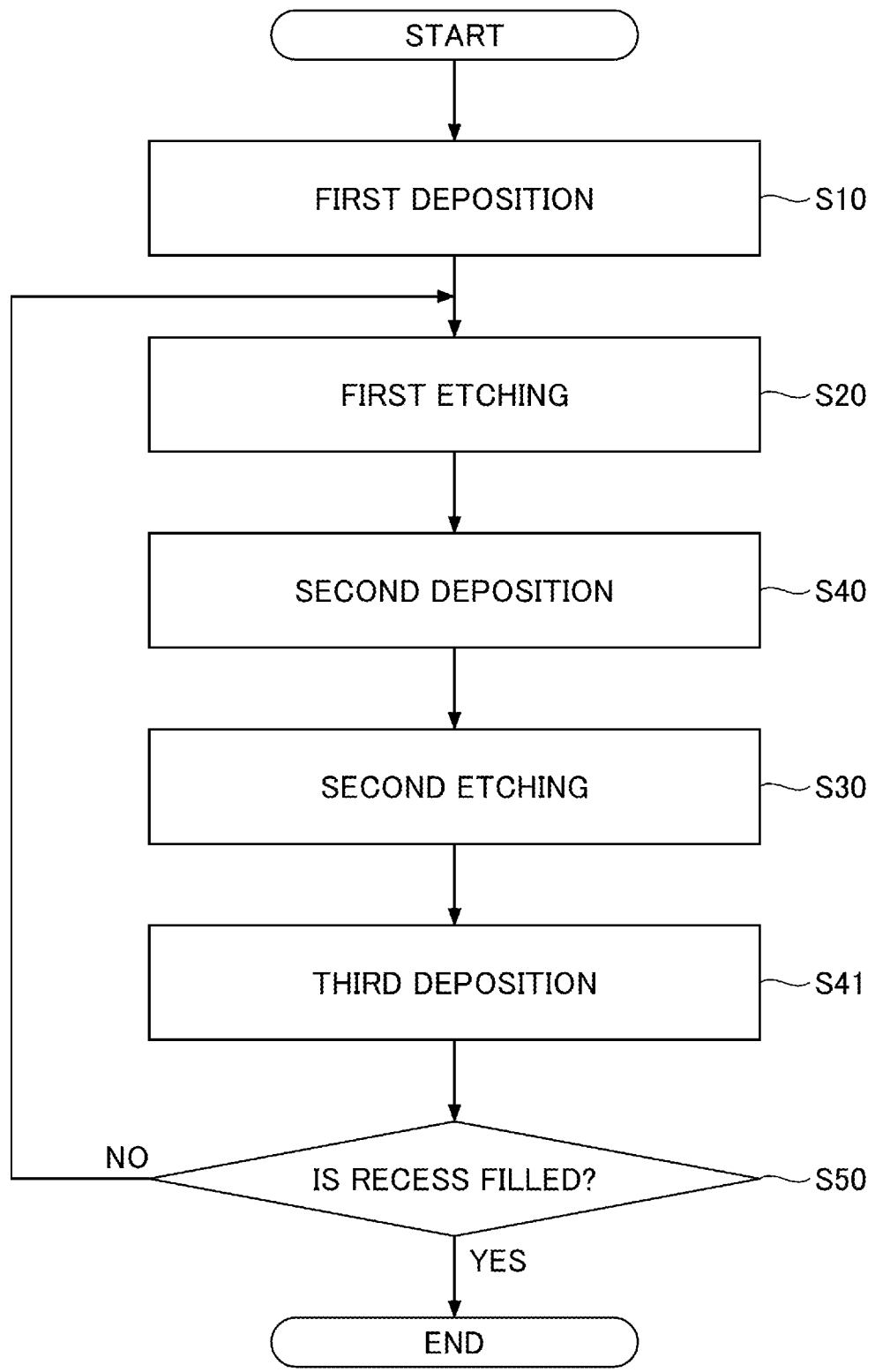
FIG. 9 is a processing flow diagram illustrating an example of a method for manufacturing a semiconductor device according to a second embodiment.

FIG. 9 is a processing flow diagram illustrating an example of a method for manufacturing a semiconductor device according to a second embodiment. In FIG. 9, substantially the same processing steps as those in the method for manufacturing the semiconductor device according to the first embodiment are denoted with the same reference numerals, and explanation about such steps is omitted.

In step S10, the first deposition step is performed to form the silicon film 45 on the seed layer 44.

In step S20, the first etching step is performed, and the opening on the upper portion of the silicon film 45 is enlarged.

In step S40, the second deposition step is performed. This point is different from the method for manufacturing the semiconductor device according to the first embodiment. Specifically, the first etching step and the second etching step do not have to be performed successively, and there may be a deposition step performed between the first etching step and the second etching step. In the first etching step, the opening on the upper portion becomes larger, and the silicon film 45 is deposited in a conformal manner in the deposition step, and therefore, the deposition is performed while the opening on the upper portion is kept wide.

In step S30, the second etching step is performed. After the deposition is performed, the opening below the protrusion 42b is widened.

In step S41, the third deposition step is performed. In the third deposition step, a new silicon film 45a is deposited on the silicon film 45 subjected to the second etching.

In step S50, a determination is performed as to whether the recess 42a has been completely filled with the silicon films 45 and 45a. When it is determined that the recess 42a has been completely filled and the state as illustrated in FIG. 6E is attained, the processing flow is ended.

However, in a case where the recess 42a has not yet been filled, the processing flow returns back to step S20, and the first etching step is performed. The first etching step in step S20 to the third deposition step in step S41 are repeated, and when the recess 42a has been completely filled with the silicon films 45 and 45a in step S50, the processing flow is ended.

The method for manufacturing the semiconductor device according to second embodiment performs a process of "DE1DE2D" that is a process in which, after the first "D" is performed, a cycle of "E1DE2D" is repeated until the recess 42a is filled. In this manner, a deposition step may be interposed between the first etching step and the second etching step. In the deposition step, depositions are performed under the same condition without changing the condition, and therefore all of the depositions are denoted with "D".

Figure 10:
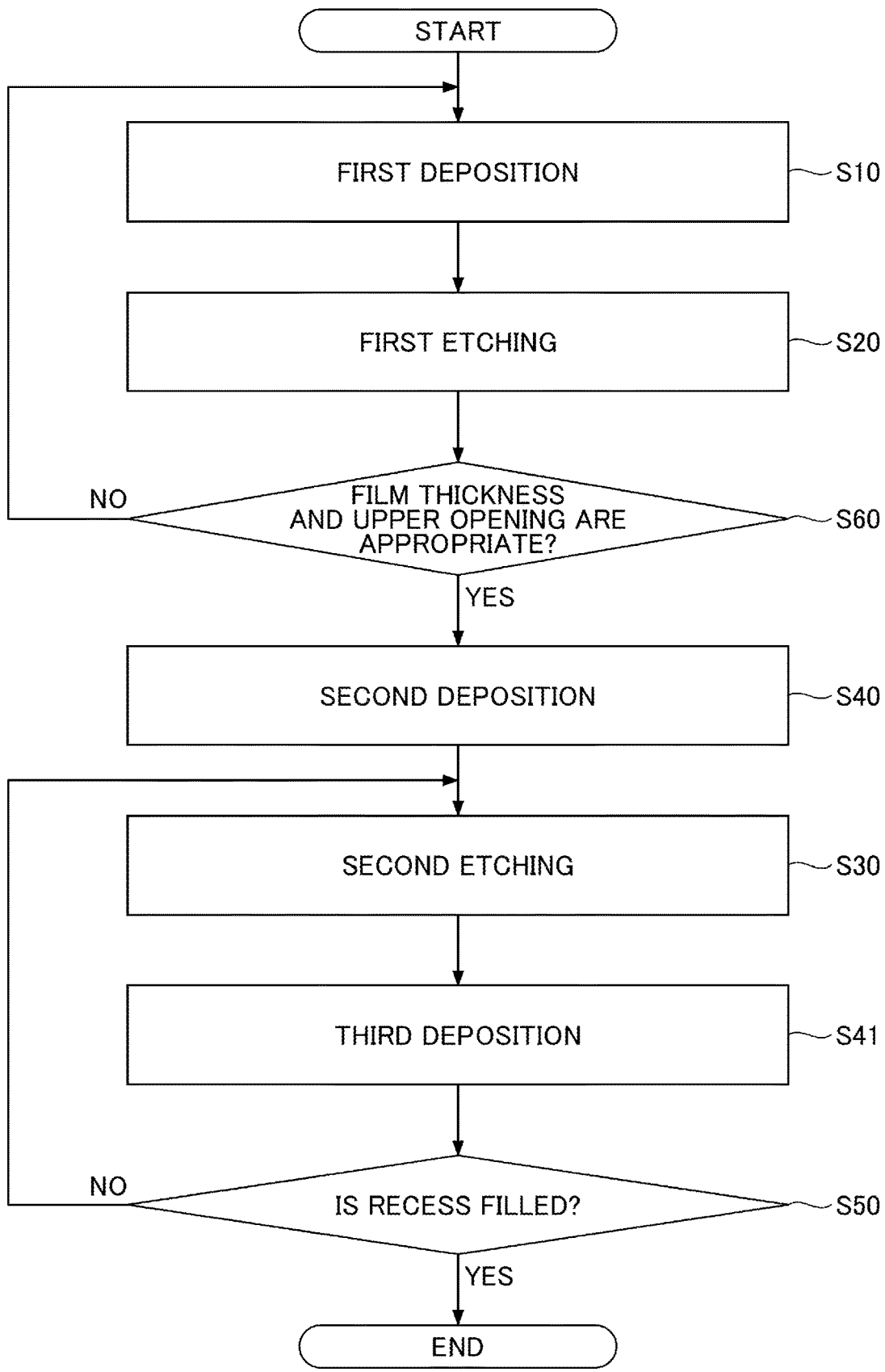
FIG. 10 is a processing flow diagram illustrating an example of a method for manufacturing a semiconductor device according to a third embodiment.

FIG. 10 is a processing flow diagram illustrating an example of a method for manufacturing a semiconductor device according to a third embodiment. Similar to FIG. 9, substantially the same processing steps as those in the method for manufacturing the semiconductor device according to the first embodiment are denoted with the same reference numerals, and explanation about such steps is omitted.

In step S10, the first deposition step is performed to deposit the silicon film 45 on the seed layer 44.

In step S20, the first etching step is performed to widen the opening on the upper portion of the silicon film 45.

In step S60, a determination is made as to whether the film thickness of the silicon film 45 formed in the first deposition step and the opening on the upper portion formed in the first etching step are appropriate. In a case where it is determined that the film thickness is insufficient or the size of the opening is insufficient, the processing flow returns back to the first deposition step in step S10 to repeat the first deposition in step S10 and the first etching step in step S20.

In a case where the film thickness of the silicon film 45 and the opening on the upper portion are determined to be sufficient in step S60, the processing flow proceeds to the second deposition step in step S40.

In step S30, the second etching step is performed. In the second etching step, the silicon film 45 on the protrusion 42b and below the protrusion 42b are etched to widen the opening of the silicon film 45 at the protrusion 42b and below the protrusion 42b.

In step S41, the third deposition step is performed. In the third deposition step, a new silicon film 45a is deposited on the silicon film 45 etched in the second etching step.

In step S50, a determination is made as to whether the recess 42a has been filled with the silicon films 45 and 45a. In a case where it is determined that the recess 42a has been filled, the processing flow is ended.

Conversely, in a case where it is determined that the recess 42a has not been filled with the silicon films 45 and 45a, the processing flow returns back to step S30 to perform the second etching step again. The second etching step in step S30 and the third deposition step in step S41 are repeated until recess 42a is filled with the silicon films 45 and 45a.

Then, in a case where it is determined that the recess 42a has been filled with the silicon films 45 and 45a in step S50, the processing flow is ended.

The method for manufacturing the semiconductor device according to third embodiment performs a process in which a cycle of "DE1" is repeated and thereafter, after "D" is performed, a cycle of "E2D" is repeated.

As hereinabove described in the first to third embodiments, the deposition step, the first etching step, and the second etching step may be performed in various combinations.

Although the step of determination is provided in the first to third embodiments, an appropriate number of times "DE" is repeated may be derived in advance, and a cycle "DE" may be repeated for the appropriate number of times that is configured in advance.

Also, the order in which the first etching step and the second etching step are performed may be reversed depending on the shape of the recess 42a, and an etching step of still another profile may be combined.

In this manner, two-step etching including different types of etching is performed in the DED process, so that even in a case where an unevenness is formed on the lateral surface of the recess 42a, the recess 42a can be filled with the silicon films 45 and 45a without generating a void.

In the present embodiment, for example, a vertical heat processing apparatus has been explained as an example of a substrate processing device. Alternatively, the substrate processing device may be configured as a single-wafer deposition apparatus or a semi-batch type deposition device that performs atomic layer deposition (ALD) on about five to six wafers W using a rotation table.

Also, the principle of the present disclosure can be applied to a substrate processing device using plasma. Specifically, the method for manufacturing the semiconductor device and the substrate processing device according to the present embodiment can be widely applied to a process and a substrate processing device in which recesses are filled with silicon films using the DED process.

According to the present disclosure, a recess can be filled with a film without generating a void.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A method for manufacturing a semiconductor device, comprising:
    supplying a silicon-containing gas to a substrate having a recess formed in a surface of the substrate to deposit a silicon film in the recess;
    supplying, to the substrate, a first etching gas having a first etching profile in which an amount of etching for an upper portion of the recess in a depth direction and an amount of etching for a lower portion of the recess in the depth direction are different from each other, to etch the silicon film in the recess;
    supplying, to the substrate, a second etching gas having a second etching profile that is different from the first etching profile of the first etching gas to etch the silicon film in the recess; and
    additionally depositing the silicon film on the already deposited silicon film etched by the second etching gas,
    wherein the first etching gas includes chlorine gas and nitrogen gas, and the second etching gas includes chlorine gas and nitrogen gas, and
    wherein a mixing ratio of the chlorine gas and the nitrogen gas in the second etching gas is different from the first etching gas.

2. The method for manufacturing the semiconductor device according to claim 1, wherein in the first etching profile of the first etching gas, the amount of etching for the upper portion of the recess in the depth direction is higher than the amount of etching for the lower portion of the recess in the depth direction,
    a ratio of the amount of etching for the lower portion to the amount of etching for the upper portion in the second etching profile of the second etching gas is more than a ratio of the amount of etching for the lower portion to the amount of etching for the upper portion in the first etching profile of the first etching gas, or in the second etching profile of the second etching gas, the amount of etching for the upper portion is the same as the amount of etching for the lower portion.

3. The method for manufacturing the semiconductor device according to claim 2, wherein the first etching profile is a profile for widening an opening in the silicon film on the upper portion to make the opening a shallow V-shaped opening, and
    the second etching profile is a profile for forming a deep V-shaped opening in the silicon film on the lower portion.

4. The method for manufacturing the semiconductor device according to claim 1, wherein the first etching gas and the second etching gas are generated by adding, to the chlorine gas, the nitrogen gas with different flow rates.

5. The method for manufacturing the semiconductor device according to claim 4, wherein a flow rate of the diluent gas is higher in the second etching gas than in the first etching gas.

6. The method for manufacturing the semiconductor device according to claim 1, wherein the recess is in such a shape that unevenness is formed on a lateral surface of the recess.

7. The method for manufacturing the semiconductor device according to claim 1, wherein the supplying of the first etching gas to the substrate to etch the silicon film in the recess, the supplying of the second etching gas to the substrate to etch the silicon film in the recess, and the additional depositing of the silicon film on the already deposited silicon film are repeatedly performed.

8. The method for manufacturing the semiconductor device according to claim 1, further comprising, between the supplying of the first etching gas to the substrate to etch the silicon film in the recess and the supplying of the second etching gas to the substrate to etch the silicon film in the recess, additionally depositing the silicon film on the already deposited silicon film etched by the first etching gas.

9. A method for manufacturing a semiconductor device, comprising:
    supplying a silicon-containing gas to a substrate having a recess formed in a surface of the substrate to deposit a silicon film in the recess;
    supplying, to the substrate, a first etching gas having a first etching profile in which an amount of etching for an upper portion of the recess in a depth direction and an amount of etching for a lower portion of the recess in the depth direction are different from each other, to etch the silicon film in the recess;
    executing at least once a cycle including additionally depositing the silicon film on the already deposited silicon film etched by the first etching gas;
    executing at least once a first cycle including supplying the first etching gas to the substrate to etch the silicon film in the recess and additionally depositing the silicon film on the already deposited silicon film;
    supplying, to the substrate, a second etching gas having a second etching profile that is different from the first etching profile of the first etching gas to etch the silicon film in the recess;
    additionally depositing the silicon film on the already deposited silicon film etched by the second etching gas; and
    executing at least once a second cycle including supplying the second etching gas to the substrate to etch the silicon film in the recess and additionally depositing the silicon film on the already deposited silicon film,
    wherein the first etching gas includes chlorine gas and nitrogen gas, and the second etching gas includes chlorine gas and nitrogen gas, and
    wherein a mixing ratio of the chlorine gas and the nitrogen gas in the second etching gas is different from the first etching gas.

10. The method for manufacturing the semiconductor device according to claim 9, wherein in the first etching profile of the first etching gas, the amount of etching for the upper portion of the recess in the depth direction is higher than the amount of etching for the lower portion of the recess in the depth direction,
    a ratio of the amount of etching for the lower portion to the amount of etching for the upper portion in the second etching profile of the second etching gas is less than a ratio of the amount of etching for the lower portion to the amount of etching for the upper portion in the first etching profile of the first etching gas, or in the second etching profile of the second etching gas, the amount of etching for the upper portion is the same as the amount of etching for the lower portion.

11. The method for manufacturing the semiconductor device according to claim 10, wherein the first etching profile is a profile for widening an opening in the silicon film on the upper portion to make the opening a shallow V-shaped opening, and the second etching profile is a profile for forming a deep V-shaped opening in the silicon film on the lower portion.

12. The method for manufacturing the semiconductor device according to claim 9, wherein the first etching gas and the second etching gas are generated by adding, to the chlorine gas, the nitrogen gas with different flow rates.

13. The method for manufacturing the semiconductor device according to claim 12, wherein a flow rate of the diluent gas is higher in the second etching gas than in the first etching gas.

14. The method for manufacturing the semiconductor device according to claim 9, wherein the recess is in such a shape that unevenness is formed on a lateral surface of the recess.

15. The method for manufacturing the semiconductor device according to claim 9, wherein the supplying of the first etching gas to the substrate to etch the silicon film in the recess, the supplying of the second etching gas to the substrate to etch the silicon film in the recess, and the additional depositing of the silicon film on the already deposited silicon film are repeatedly performed.

* * * * *